United States Patent
Kwan et al.

(10) Patent No.: US 6,528,430 B2
(45) Date of Patent: Mar. 4, 2003

(54) METHOD OF FORMING SILICON CONTAINING THIN FILMS BY ATOMIC LAYER DEPOSITION UTILIZING $Si_2Cl_6$ AND $NH_3$

(75) Inventors: Kim Yeong Kwan, Suwon (KR); Park Young Wook, Suwon (KR); Lee Joo Won, Suwon (KR); Kim Dong Chan, Seoul (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/847,161

(22) Filed: May 1, 2001

(65) Prior Publication Data

US 2002/0164890 A1 Nov. 7, 2002

(51) Int. Cl.[7] .................. H01L 21/31; H01L 21/469; C23C 16/30; C23C 16/24; C23C 16/00; C23C 16/08; C30B 23/00; C30B 25/00
(52) U.S. Cl. .................. 438/763; 438/971; 427/255.17; 427/255.18; 427/255.23; 427/255.28; 427/255.39; 427/255.393; 117/88; 117/89; 117/93; 117/102; 117/105
(58) Field of Search .................. 438/763, 971; 427/255.18, 255.17, 255.23, 255.28, 255.39, 255.15, 255.393; 117/88, 89, 93, 102, 105

(56) References Cited

U.S. PATENT DOCUMENTS

| | | | | |
|---|---|---|---|---|
| 5,300,322 A | * | 4/1994 | Lowden | 427/255 |
| 6,090,442 A | * | 7/2000 | Klaus et al. | 427/255.15 |
| 6,326,658 B1 | * | 12/2001 | Tsunashima et al. | 257/301 |
| 6,333,547 B1 | * | 12/2001 | Tanaka et al. | 257/649 |

OTHER PUBLICATIONS

Yokoyam, et al; Atomic Layer Controlled Deposition of Silicon Nitride and in Situ Growth Observation by Infrared Reflection Absorption Spectroscopy; *Appl. Surf. Sci.*, 112, 75–81 (1997).

Goto, et al.; Atomic Layer Controled Deposition of Silicon Nitride With Self–Limiting Mechanism; *Appl. Phys. Lett.*, 68(23), 3257–9 (1996).

Morishita, et al; Atomic–Layer Chemical–Vapor–Deposition of Silicon–Nitride; *Appl. Surf. Sci*, 112, 198–204 (1997).

* cited by examiner

*Primary Examiner*—John F. Niebling
*Assistant Examiner*—Viktor Simkovic
(74) *Attorney, Agent, or Firm*—Marger Johnson & McCollom, P.C.

(57) ABSTRACT

An atomic layer deposition (ALD) method employing $Si_2Cl_6$ and $NH_3$, or $Si_2Cl_6$ and activated $NH_3$ as reactants. In one embodiment, the invention includes the steps of (a) placing a substrate into a chamber, (b) injecting a first reactant containing $Si_2Cl_6$ into the chamber, (c) chemisorbing a first portion of the first reactant onto the substrate and physisorbing a second portion of the first reactant onto the substrate, d) removing the non-chemically absorbed portion of the first reactant from the chamber, (e) injecting a second reactant including $NH_3$ into the chamber, (f) chemically reacting a first portion of the second reactant with the chemisorbed first portion of the first reactant to form a silicon-containing solid on the substrate, and (g) removing the unreacted portion of the second reactant from the chamber. In other embodiments, the first reactant can contain two or more compounds containing Si and Cl, such as $Si_2Cl_6$ and $SiCl_4$. In another embodiment of the invention, steps b–g are repeated one or more times to increase the thickness of the layer.

24 Claims, 7 Drawing Sheets

METHOD OF FORMING SILICON CONTAINING THIN FILMS BY ATOMIC LAYER DEPOSITION UTILIZING SI$_2$CL$_6$ AND NH$_3$

BACKGROUND OF THE INVENTION

The present invention relates to the forming of a Si$_3$N$_4$ thin film by atomic layer deposition (ALD). Specifically, the invention is embodied in the formation of a Si$_3$N$_4$ thin film by utilizing an atomic layer deposition method and employing Si$_2$Cl$_6$ (HCD) and NH$_3$, or HCD and NH$_3$ plasma as reactants.

Si$_3$N$_4$ thin films are becoming increasingly important in the manufacture of semiconductor devices. Si$_3$N$_4$ films at Si/SiO$_2$ interfaces decrease interface traps and improve hot carrier immunity. Si3N4 films improve the reliability and performance of conventional SiO$_2$ gate oxides. Si$_3$N$_4$ films at the SiO$_2$/gate interface serve as excellent diffusion barriers, notably with respect to alkaline ions. In ultra thin film devices, Si$_3$N$_4$ could provide a high dielectric constant material that resists electron tunneling. Si$_3$N$_4$, having a higher dielectric constant than SiO$_2$, could also prove very useful as a conformational insulating layer covering high aspect ratio features in DRAMS and other devices. These applications require a method of forming a Si$_3$N$_4$ thin film that exhibits good characteristics with respect to growth rates, thermal budget, pattern loading, purity, uniformity of thickness, and conformity to high aspect ratio features.

Deposition methods such as chemical vapor deposition (CVD), low-pressure chemical vapor deposition (LPCVD), plasma-enhanced chemical vapor deposition (PECVD) can be utilized for the preparation of a Si$_3$N$_4$ thin film. CVD-based methods often have drawbacks that limit their usefulness in the manufacture of semiconductor devices that would benefit by inclusion of thin films of Si$_3$N$_4$. In a typical CVD method, a thin film of SiN is deposited at a relatively high temperature, which in general is, less preferable than a lower temperature process due to the possibility of adverse thermal effects on the device. A SiN layer deposited by CVD is also subject to geometric hindrances causing thickness variations across the surface of the device. The thickness of the thin film formed around densely packed features on the surface can be less than the thickness of the film around less densely packed features. This problem is known as a pattern loading effect.

LPCVD suffers from shortcomings as well. The hydrogen content of the LPCVD-manufactured thin film is usually high, and step coverage of the surface is not good. Since the film growth rate is relatively slow when using LPCVD, the processing time required to grow a film of suitable thickness is relatively long. The long processing time exposes the substrate to a relatively high temperature for a long time, and results in a high thermal budget associated with the LPCVD process.

Atomic layer deposition (ALD) has been proposed as an alternative to CVD-based depositions methods for the formation of SiN thin films. ALD is a surface controlled process conducted in a surface kinetic regime, and which results in two-dimensional layer-by-layer deposition on the surface. Goto et al. describe an ALD deposition method using dichlorosilane (DCS) and NH$_3$ plasma to form a Si$_3$N$_4$ film. (Appl. Surf. Sci., 112, 75–81 (1997); Appl. Phys. Lett. 68 (23), 3257–9 (1996)). However, the properties of the thin film manufactured by the method described in Goto are not suitable. The Cl content (0.5%), and O content are unacceptably high. These, combined with a measured Si:N ratio of 41:37 indicate that this method does not form a near-stoichiometric film of Si$_3$N$_4$. In addition, the growth rate of 0.91 angstroms per cycle of 300 seconds is not as high as would be necessary for commercial applications.

Klaus et al. describe an ALD method of forming a Si$_3$N$_4$ film by reacting SiCl$_4$ and NH$_3$. See, U.S. Pat. No. 6,090, 442, and Surf. Sci., 418, L14–L19 (1998). The characteristics of the thin film manufactured by this method are better than that achieved by Goto et al. The ratio of Si:N=1:1.39, and the Cl, H and O contents are acceptably low. However, the cycle time of 10 minutes to grow a 2.45-angstrom film is too long, making any commercial application impractical.

It has also been proposed to use Si$_2$Cl$_6$ (HCD) and N$_2$H$_4$ to deposit a thin Si$_3$N$_4$ film by ALD. (Appl. Surf. Sci., 112, 198–203 (1997)). While the stoichiometry, Cl and H content of such films are suitable, they exhibit an unacceptably high oxygen content, rendering such films unsuitable for the uses described above.

Therefore, despite a long-recognized potential for widespread application, a need remains for a novel method of forming Si$_3$N$_4$ films that meet the following criteria: low thermal budget process; excellent step coverage; no pattern loading effect; Si:N ratio consistent with Si$_3$N$_4$; excellent thickness control and uniformity; minimal number of particulate inclusions; low impurity content; and a film growth rate that makes commercial application practical.

SUMMARY OF THE INVENTION

It is therefore an object of this invention to provide a method of forming Si$_3$N$_4$ as a film in which the Si$_3$N$_4$ embodies physical and chemical properties consistent with highly pure Si$_3$N$_4$. It is another object of the invention to provide a method of depositing Si$_3$N$_4$ as a thin film in which the method demonstrates excellent step coverage, little or no pattern loading effect, and excellent thickness control and uniformity. It is a further object of the invention to provide a method of depositing Si$_3$N$_4$ as a thin film or other solid form wherein the method demonstrates a relatively low thermal budget and an acceptably high growth rate to render the method practical for commercial application.

In order to accomplish the above-described items, the present invention is embodied in an atomic layer deposition (ALD) method employing Si$_2$Cl$_6$ and NH$_3$, or Si$_2$Cl$_6$ and activated NH$_3$ as reactants.

In one embodiment, the invention includes the steps of a) placing a substrate into a chamber, b) injecting a first reactant containing Si$_2$Cl$_6$ into the chamber, c) chemisorbing a first portion of the first reactant onto the substrate and physisorbing a second portion of the first reactant onto the substrate, d) removing the non-chemically absorbed portion of the first reactant from the chamber, e) injecting a second reactant including NH$_3$ into the chamber, f) chemically reacting a first portion of the second reactant with the chemisorbed first portion of the first reactant to form a silicon-containing solid on the substrate, and g) removing the unreacted portion of the second reactant from the chamber. In another embodiment of the invention, in step b, the first reactant contains two or more compounds, each containing Si and Cl. In a preferred embodiment thereof, the two Si and Cl containing compounds are Si$_2$Cl$_6$ and SiCl$_4$. In another embodiment of the invention, steps b–g are repeated one or more times to increase the thickness of the layer.

In yet another embodiment of the invention, the method includes the steps a) placing a substrate into a chamber, b) injecting a flow of a first reactant containing Si$_2$Cl$_6$ into the chamber, c) while injecting the first reactant into the chamber, adding $SiCl_4$ to the flow of the first reactant, d) chemisorbing a first portion of the first reactant onto the substrate and physisorbing a second portion of the first reactant onto the substrate, e) chemisorbing a first portion of the $SiCl_4$ onto the substrate and physisorbing a second portion of the $SiCl_4$ onto the substrate, f) removing the non-chemically absorbed portions of $Si_2Cl_6$ and $SiCl_4$ from the chamber, g) injecting a second reactant including $NH_3$ into the chamber, h) chemically reacting a first portion of the second reactant with the chemisorbed first portion of the $Si_2Cl_6$ and the chemisorbed first portion of $SiCl_4$ to form a silicon-containing solid on the substrate; and, i) removing a second portion of the second reactant from the chamber. In another embodiment, one or more of steps b–i are repeated. These and other features of the invention will now be explained in greater detail by reference to the following drawings and detailed description.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE PREFERRED EMBODIMENTS

The following description of preferred embodiments will begin with an explanation of the process steps of the methods, followed by descriptions of specific examples of preferred embodiments of the invention.

Referring now to FIGS. 1–5, a substrate 1 such as silicon (100) is placed in a chamber 3 (see FIG. 6), which is then evacuated to a pressure of about 2 Torr. Substrate 1 is heated to about 550° C. A stream 2 of 500 sccm of $Si_2Cl_6$ in an Ar carrier gas is then introduced into the chamber for 30 seconds. In alternate embodiments of the invention, the $Si_2Cl_6$ containing gas stream also contains $SiCl_4$. In another embodiment, a $Si_2Cl_6$ containing gas stream is introduced into chamber 3, and while maintaining this flow, a gas stream including $SiCl_4$ is either combined with the $Si_2Cl_6$ containing gas stream prior to its introduction into chamber 3, or is introduced separately but simultaneously with the $Si_2Cl_6$ containing gas stream.

Figure 1:
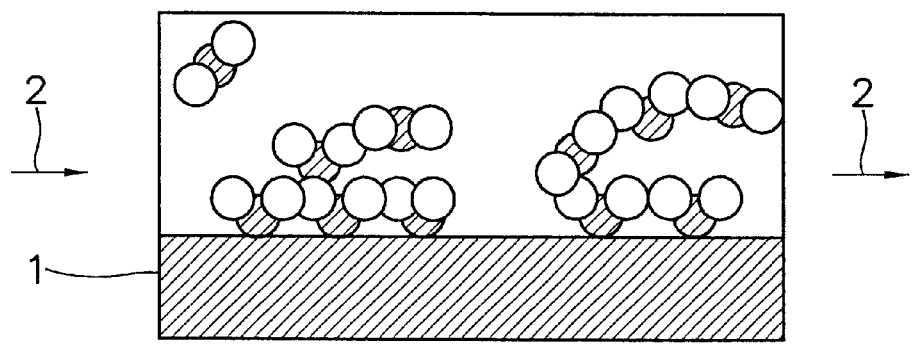
FIGS. 1 through 5 describe the steps of processes for forming a thin film of $Si_3N_4$ using an atomic layer deposition according to the present invention.
Figure 2:
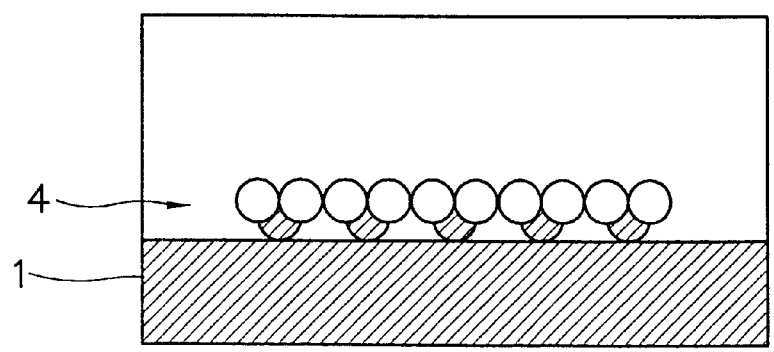
Figure 3:
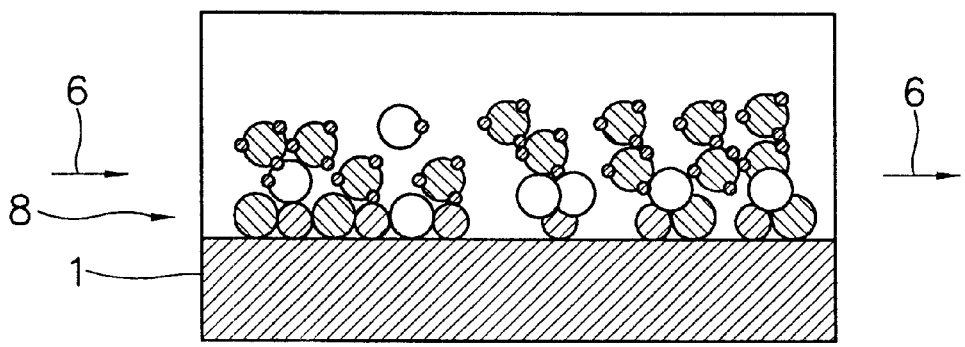
Figure 4:
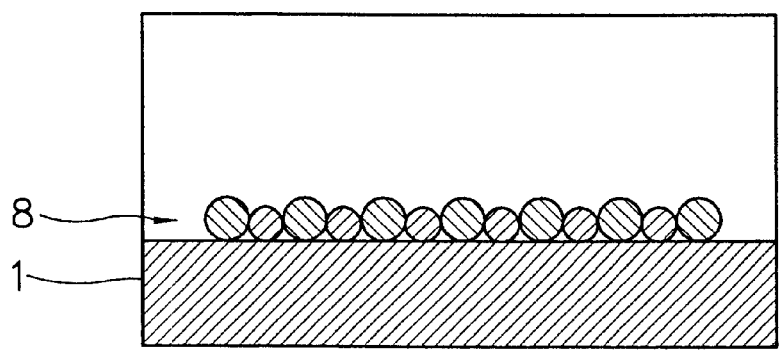
Figure 5:
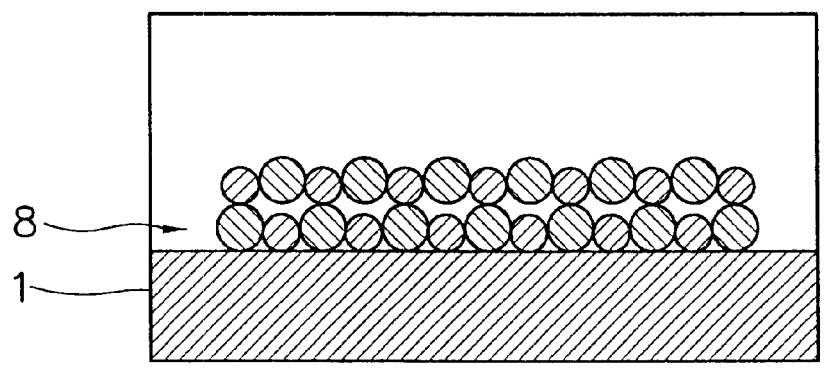

During this time, a first portion of the $Si_2Cl_6$ molecules (and $SiCl_4$ molecules if present) chemisorbs and forms a layer 4 on the surface of substrate 1. A second portion of the $Si_2Cl_6$ molecules (and $SiCl_4$ molecules if present) physically attaches (physisorbs) onto, and is loosely held to the chemisorbed layer of $Si_2Cl_6$ (and $SiCl_4$ if present). The chamber 3 is then purged with $N_2$ for 5 seconds, and vacuum purged for 5 seconds. During these purging steps, the non-chemically absorbed portions of $Si_2Cl_6$ and $SiCl_4$ are removed from the chamber, leaving the chemisorbed layer 4 of $Si_2Cl_6$ (and $SiCl_4$ if present) intact on the substrate 1 (FIG. 2). Referring now to FIG. 3, a stream 6 of 2000 sccm of $NH_3$ is then introduced into chamber 3 for 30 seconds, while again maintaining a chamber pressure of 2 Torr and a substrate temperature of 550° C. A portion of the $NH_3$ reacts with the chemisorbed $Si_2Cl_6$ on the substrate to form a layer 8 of $Si_3N_4$ (FIG. 4). In one embodiment, the $NH_3$ is introduced as a gas entrained in an Ar carrier stream. In an alternate embodiment, the $NH_3$ is entrained in the Ar stream a plasma that has been generated in a remote plasma generator. In one embodiment, the plasma generator is operated at about 400 watts, but the power can be varied and the invention is not intended to be limited to a particular plasma chamber power level. After the $NH_3$-containing stream has flowed into the chamber for 30 seconds, chamber 3 is then purged with $N_2$ for 5 seconds, and then vacuum purged for 5 seconds. The steps of introducing $Si_2Cl_6$ (and $SiCl_4$) into chamber 3, purging, introducing $NH_3$ into the chamber, and purging again can be repeated to achieve any desired thickness of $Si_3N_4$ layer 8. The formation of the $Si_3N_4$ layer 8 is now complete.

Figure 6:
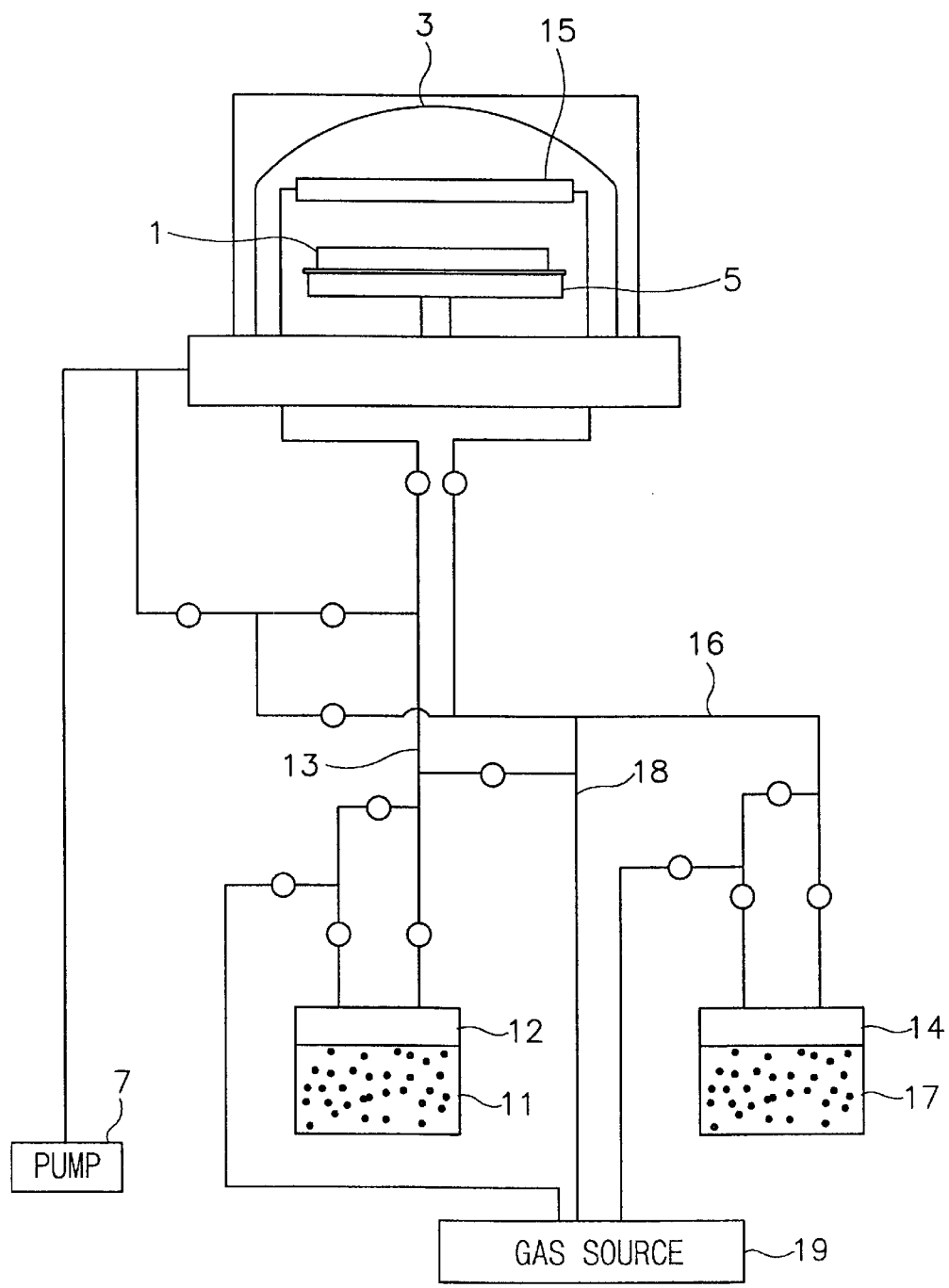
FIG. 6 is a schematic diagram of a thin film manufacturing apparatus used for a thin film manufacturing method according to the present invention.
Figure 7:
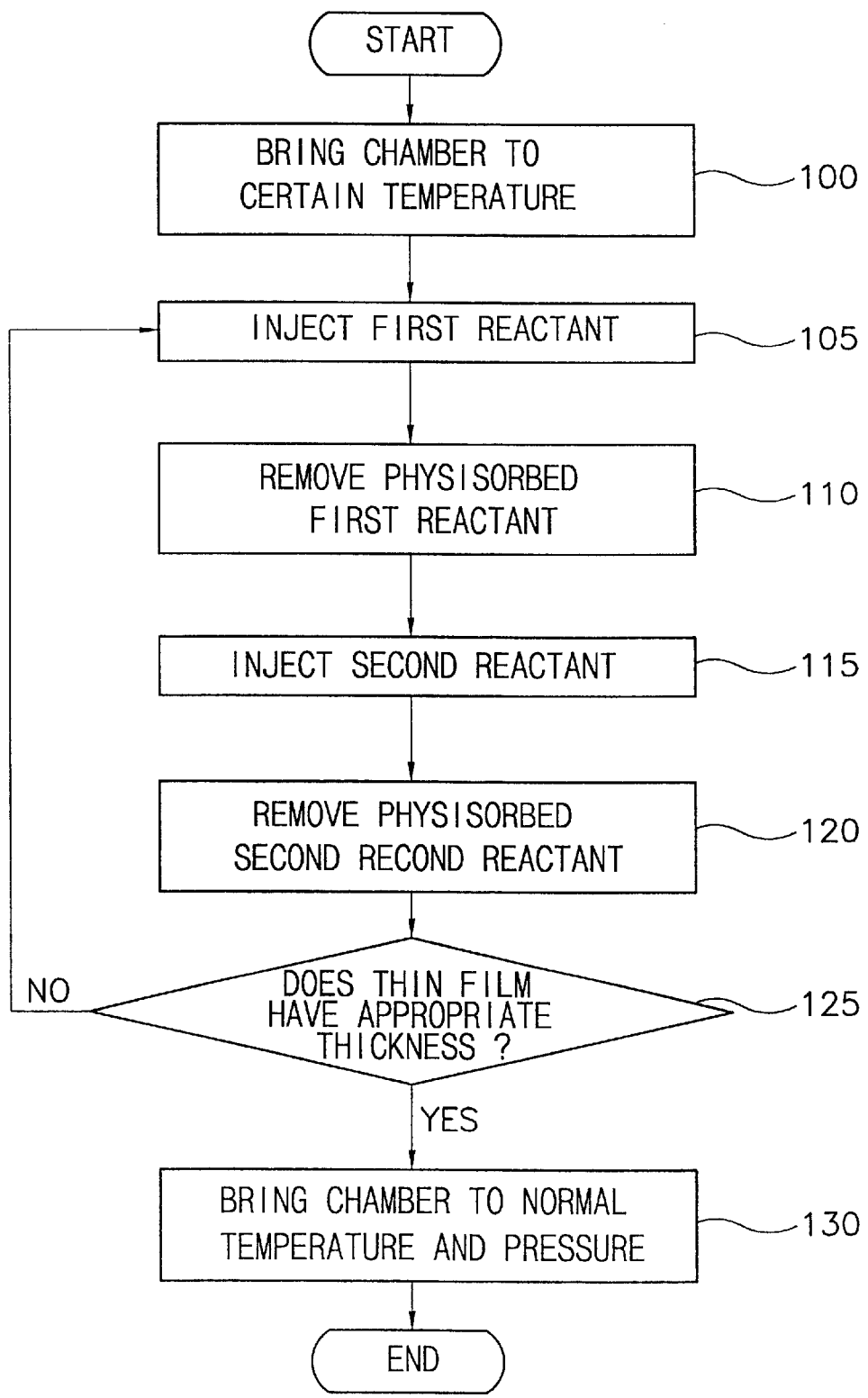
FIG. 7 is a flowchart describing the thin film manufacturing methods according to the present invention.

FIG. 6 is a schematic diagram of a thin film manufacturing apparatus used for the thin film manufacturing method according to the present invention. FIG. 7 is a flowchart describing the thin film manufacturing method according to the present invention. After loading a substrate 1, for example a (100) silicon substrate, into a chamber 3, the chamber is brought to a pressure of about 2 Torr, and to a temperature of about 550° C. using a heater 5 (step 100). The first reactant stream containing $Si_2Cl_6$ is injected into chamber 3 for 30 seconds while the substrate is maintained at 550° C. and about 2 Torr. (step 105). The $Si_2Cl_6$ is vaporized to form a first reactant stream 6 by injecting 500 sccm of Ar carrier gas from a source 19 into the first bubbler 12, which contains liquid $Si_2Cl_6$ at a temperature of about 40° C. The combined $Si_2Cl_6$ and Ar gas stream is then injected into chamber 3 through a first gas line 13 and a shower head 15 for a period of about 30 seconds, as described above. Chamber 3 is then purged with pure Ar for 5 seconds, and then vacuum purged by pump 7 for 5 seconds. The invention is not intended to be limited to this particular purging scheme, and is intended to include alternate purging sequences that result in the removal of the physisorbed $Si_2Cl_6$ from the chemisorbed surface layer of $Si_2Cl_6$.

The second reactant gas stream of $NH_3$ in an Ar carrier is then injected into chamber 3 through gas line 16 and showerhead 15 for about 30 seconds at a rate of about 2000 sccm. During this step the substrate 1 is maintained at 550° C. and the chamber pressure is maintained at about 2 Torr (step 115 in FIG. 7). In one embodiment, the $NH_3$ in the second reactant gas stream is vaporized by bubbling Ar from gas source 19 through liquid $NH_3$ 14 held at about 25 C in a second bubbler 17. In another preferred embodiment, $NH_3$ is injected into chamber 3 as a plasma carried in an Ar stream. The $NH_3$ plasma is generated in a remote plasma generator (not shown), and then introduced into chamber 3 through gas line 16 and showerhead 15 for about 30 seconds at a rate of about 2000 sccm.

As represented in FIGS. 3 and 4, a portion of the $NH_3$ in the second reactant stream reacts with the $Si_2Cl_6$ (and $SiCl_4$ in some embodiments) chemisorbed on the substrate 1 to form a layer of $Si_3N_4$. As the layer of $Si_3N_4$ is formed on the substrate, a second portion of the $NH_3$ in the second reactant stream is physisorbed onto the $Si_3N_4$ layer. The chamber 3 is then purged using an Ar stream for 5 seconds, followed by vacuum purging using pump 7 (step 120). However, the physisorbed second reactant can be also removed by vacuum pumping the chamber without first purging with an inert gas.

After purging the unreacted $NH_3$ from chamber 3, the $Si_3N_4$ film thickness is measured (step 125). If additional layer thickness is required, steps 105 through 125 are repeated until the desired film thickness is achieved. When the desired thickness has been reached, the manufacturing process is completed by returning the temperature and the pressure of the chamber to normal (step 130).

The preferred embodiments will now be described with reference to the following examples. The following examples are intended to be exemplary of preferred embodiments of the invention, and not limiting.

EXAMPLE 1

A silicon wafer was placed in a deposition chamber of typical design. The chamber was purged with nitrogen, then evacuated to 2 Torr. The substrate was heated to 550° C. and stabilized at that temperature. A first reactant stream was generated by bubbling 500 sccm of Ar through liquid $Si_2Cl_6$ at 40° C., and then introduced into the chamber for 30 seconds. The chamber was then purged with $N_2$ for 5 seconds, and vacuum purged or 5 seconds. A second reactant stream was then generated by bubbling 2000 sccm of Ar through liquid $NH_3$ at 25° C. The second reactant stream was then introduced into the chamber for 30 seconds, again maintaining a chamber pressure of 2 Torr, and a substrate temperature of 550° C. The chamber was then purged with $N_2$ for 5 seconds, and then vacuum purged for 5 seconds.

Figure 8:
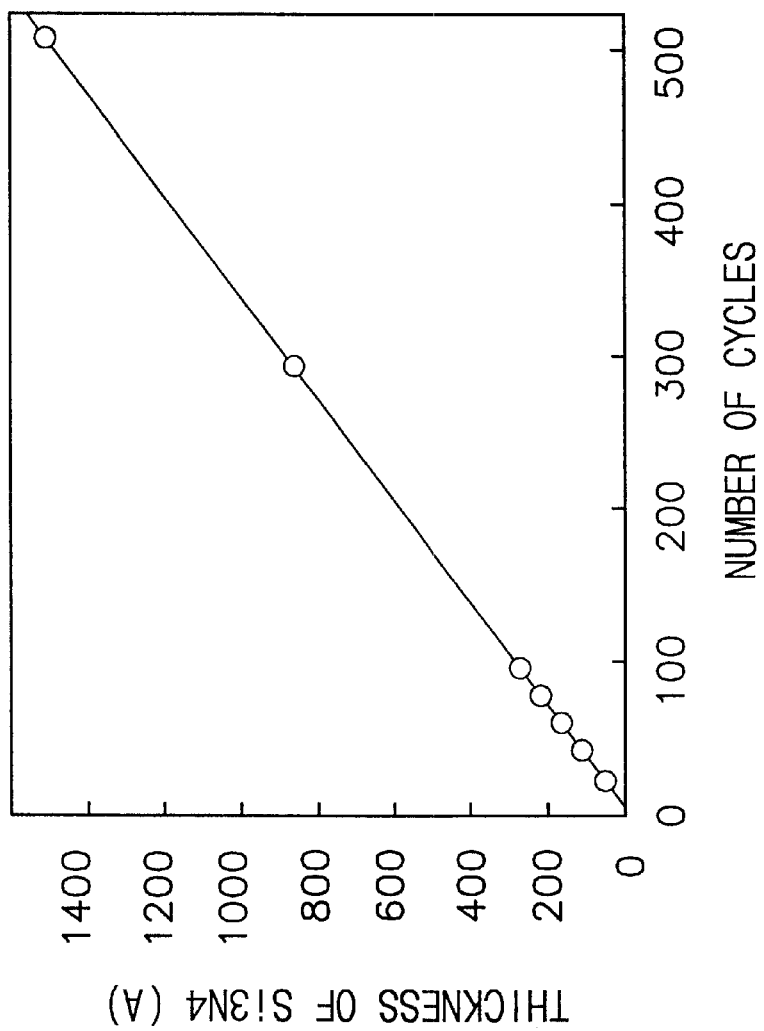
FIG. 8 is a graph showing the thickness of a $Si_3N_4$ film formed per cycle using a manufacturing method according to one preferred embodiment of the present invention.

It was found that by the foregoing steps, a $Si_3N_4$ film was formed at a rate of 2.68 Å per cycle. The $Si_3N_4$ was found to be of very high quality. The refractive index was 2.0 at a wavelength of 632.8 nm, indicating that the deposited layer was stoichiometric $Si_3N_4$. Measured tensile stress was high at 5E10 dyne/cm2. The $Si_3N_4$ deposited by this method exhibits a Si:N ratio comparable to that of pure $Si_3N_4$, and has very low contaminant levels. The hydrogen content was very low, and no oxygen was detected. Step coverage was 98% or higher in a structure having an aspect ratio of 5:1, and the film exhibited a pattern loading effect of about 5% or less. In this example, other silicon wafers were subjected to repeated cycles the same as that above. Referring to FIG. 8, it was found that thickness of the $Si_3N_4$ film bears a linear relationship to the number of cycles. Example 1 thereby demonstrates that this embodiment of the invention results in the formation of a layer of highly pure $Si_3N_4$ at a rate of about 2.68 Å per cycle. The formation of the $Si_3N_4$ layer occurs at a relatively low temperature of 550° C., and in a relatively short cycle time of less than about 90 seconds.

EXAMPLE 2

In Example 2, the processing conditions were, for the most part, similar to those of Example 1. Example 2 differs from Example 1 in that the second reactant comprised an $NH_3$ plasma in an Ar carrier gas. A silicon wafer was again placed in a deposition chamber of typical design. The chamber was purged with nitrogen, then evacuated to 2 Torr. The substrate was heated to 550° C. and stabilized. A first reactant stream containing $Si_2Cl_6$ in an Ar carrier gas was generated in the manner described in Example 1. A flow of 500 sccm of the first reactant gas was introduced into the chamber for 30 seconds. The chamber was then purged with $N_2$ for 5 seconds, and vacuum purged for 5 seconds. A second reactant stream of $NH_3$ plasma in an Ar carrier was generated by introducing a stream of $NH_3$ in an Ar carrier gas into a plasma chamber. The plasma chamber was operating at 400 watts. A flow of 2000 sccm of $NH_3$ plasma/Ar mixture was then introduced into the chamber for 30 seconds. The chamber was then purged with $N_2$ for 5 seconds, and then vacuum purged for 5 seconds.

Figure 9:
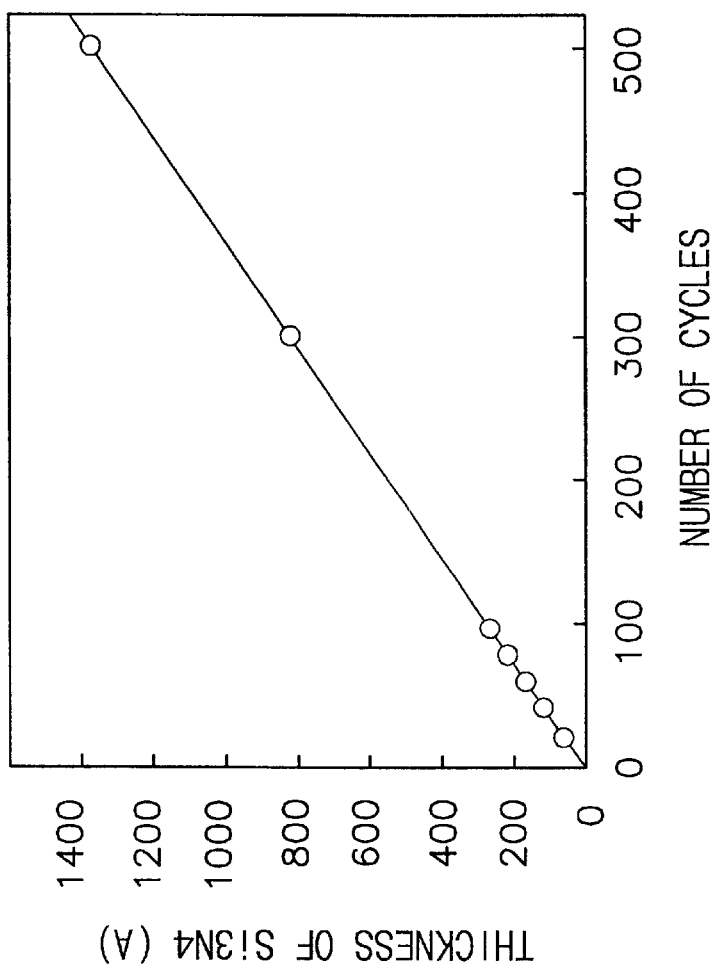
FIG. 9 is a graph showing the thickness of a $Si_3N_4$ film formed per cycle using a manufacturing method according to a second preferred embodiment of the present invention.

It was found that the foregoing method resulted in the deposition of a $Si_3N_4$ film at a rate of 2.51 Å per cycle, with a cycle time of less than 90 seconds. The deposited $Si_3N_4$ was found to be of very high quality. The refractive index was 1.95 at the wavelength of 632.8 nm, confirming that the deposited layer was stoichiometric $Si_3N_4$. Measured tensile stress was high at 7E10 dyne/cm². The hydrogen content was less than 3%, and no oxygen was detected. As was the case in Example 1, step coverage was 98% or higher in a structure having an aspect ratio of 5:1, and the pattern loading effect was good at 5% or less. In this example, other silicon wafers were subjected to repeated cycles as described above. Referring to FIG. 9, it was found that thickness of the $Si_3N_4$ film bears a linear relationship to the number of cycles.

EXAMPLE 3

In Example 3, the method was the same as that of Example 2, with the single exception that the substrate temperature was lowered to 400° C. It was found that the method of Example 3 resulted in the formation of a $Si_3N_4$ film at a rate of 1.23 Å per cycle, with a cycle time of less than 90 seconds. The deposited $Si_3N_4$ was again found to be of very high quality. The refractive index was 1.95 at the wavelength of 632.8 nm, confirming that the deposited layer was stoichiometric $Si_3N_4$. Measured tensile stress was high at 7E10 dyne/cm². The hydrogen content was less than 3%, and no oxygen was detected. However, Example 3 demonstrates that the $Si_3N_4$ film growth rate is strongly temperature dependent, and that at a temperature of 400° C., the film growth rate is about one half the growth rate at 550° C. The lower temperature of 400° C. also resulted in a higher hydrogen content in the $Si_3N_4$ film.

EXAMPLE 4

A silicon wafer was placed in a deposition chamber of typical design. The chamber was purged with nitrogen, then evacuated to 2 Torr. The substrate was heated to 550° C. and stabilized at that temperature. A first reactant stream was generated by bubbling 500 sccm of Ar through liquid $Si_2Cl_6$ at 40° C. Another stream containing Si and Cl was generated by bubbling 500 sccm of Ar through liquid $SiCl_4$ at 20° C. The streams were then simultaneously introduced into the chamber for 30 seconds, after which the flow of both streams was terminated. The chamber was then purged with $N_2$ for 5 seconds, and vacuum purged for 5 seconds. A second reactant stream was then generated by bubbling 2000 sccm of Ar through liquid $NH_3$ at 25° C. The second reactant stream was then introduced into the chamber for 30 seconds, again maintaining a chamber pressure of 2 Torr, and a substrate temperature of 550° C. The chamber was then purged with $N_2$ for 5 seconds, and then vacuum purged for 5 seconds.

It was found that by the foregoing steps, a $Si_3N_4$ film was formed at a rate of 2.72 Å per cycle. The $Si_3N_4$ was found to be of very high quality. The refractive index was 2.01 at a wavelength of 632.8 nm, indicating that the deposited layer was stoichiometric $Si_3N_4$. The $Si_3N_4$ deposited by this method exhibits a Si:N ratio comparable to that of pure $Si_3N_4$, and has very low contaminant levels. The hydrogen content was <1%, and no oxygen was detected. Step coverage was 98% or higher in a structure having an aspect ratio of 5:1, and the film exhibited a pattern loading effect of less than 5%. Example 4 thereby demonstrates that this embodiment of the invention results in the formation of a layer of highly pure $Si_3N_4$ at a rate of about 2.72 Å per cycle. The formation of the $Si_3N_4$ layer occurs at a relatively low temperature of 550° C., and in a relatively short cycle time of less than about 90 seconds. In this example, other silicon wafers were subjected to repeated cycles the same as that above. It was found that thickness of the $Si_3N_4$ film bears a linear relationship to the number of cycles.

EXAMPLE 5

A silicon wafer was placed in a deposition chamber of typical design. The chamber was purged with nitrogen, then evacuated to 2 Torr. The substrate was heated to 550° C. and stabilized at that temperature. A first reactant stream was generated by bubbling 500 sccm of Ar through liquid $Si_2Cl_6$ at 40° C. Another stream containing Si and Cl was generated by bubbling 500 sccm of Ar through liquid $SiCl_4$ at 20° C. Both streams were then simultaneously introduced into the chamber for 30 seconds, after which the flow of both streams was terminated. The chamber was then purged with $N_2$ for 5 seconds, and vacuum purged for 5 seconds. A second reactant stream of $NH_3$ plasma in an Ar carrier was generated by introducing a stream of $NH_3$ in an Ar carrier gas into a plasma chamber. The $NH_3$ plasma was generated by use of plasma generator operating at 400 watts. A flow of 2000 sccm of $NH_3$ plasma/Ar mixture was then introduced into the chamber for 30 seconds. The chamber was then purged with $N_2$ for 5 seconds, and then vacuum purged for 5 seconds.

It was found that by the foregoing steps, a $Si_3N_4$ film was formed at a rate of 2.54 Å per cycle. The $Si_3N_4$ was found to be of very high quality. The refractive index was 1.96 at a wavelength of 632.8 nm, indicating that the deposited layer was stoichiometric $Si_3N_4$. The $Si_3N_4$ deposited by this method exhibits a Si:N ratio comparable to that of pure $Si_3N_4$. The hydrogen content was <2.5%, and no oxygen was detected. Step coverage was 98% or higher in a structure having an aspect ratio of 5:1, and the film exhibited a pattern loading effect of less than 5%. In this example, other silicon wafers were subjected to repeated cycles the same as that above. It was found that thickness of the $Si_3N_4$ film bears a linear relationship to the number of cycles. Example 6 thereby demonstrates that this embodiment of the invention results in the formation of a layer of highly pure $Si_3N_4$ at a rate of about 2.54 Å per cycle. The formation of the $Si_3N_4$ layer occurs at a relatively low temperature of 550° C., and in a relatively short cycle time of less than about 90 seconds.

EXAMPLE 6

A silicon wafer was placed in a deposition chamber of typical design. The chamber was purged with nitrogen, then evacuated to 2 Torr. The substrate was heated to 550° C. and stabilized at that temperature. A first reactant stream was generated by bubbling 500 sccm of Ar through liquid $Si_2Cl_6$ at 40° C. Another stream containing Si and Cl was generated by bubbling 500 sccm of Ar through liquid $SiCl_4$ at 20° C. The $Si_2Cl_6$-containing stream was then introduced into the chamber for 30 seconds. Beginning 15 seconds after initiation of the flow of the $Si_2Cl_6$-containing stream into the chamber the $SiCl_4$-containing stream was introduced into the chamber for 15 seconds, during which time both the $Si_2Cl_6$-containing stream and the $SiCl_4$-containing stream were simultaneously flowing into the chamber, and after which the flow of each stream was stopped. The chamber was then purged with $N_2$ for 5 seconds, and vacuum purged for 5 seconds. A second reactant stream was then generated by bubbling 2000 sccm of Ar through liquid $NH_3$ at 25° C. The second reactant stream was then introduced into the chamber for 30 seconds again maintaining a chamber pressure of 2 Torr, and a substrate temperature of 550° C. The chamber was then purged with $N_2$ for 5 seconds, and then vacuum purged for 5 seconds.

It was found that by the foregoing steps, a $Si_3N_4$ film was formed at a rate of 2.70 Å per cycle. The $Si_3N_4$ was found to be of very high quality. The refractive index was 2.00 at a wavelength of 632.8 nm, indicating that the deposited layer was stoichiometric $Si_3N_4$. The $Si_3N_4$ deposited by this method exhibits a Si:N ratio comparable to that of pure $Si_3N_4$, and has very low contaminant levels. The hydrogen content was very low, <1%, and no oxygen was detected. Step coverage was 98% or higher in a structure having an aspect ratio of 5:1, and the film exhibited a pattern loading effect of less than 5%. In this example, other silicon wafers were subjected to repeated cycles the same as that above. It was found that thickness of the $Si_3N_4$ film bears a linear relationship to the number of cycles. Example 6 thereby demonstrates that this embodiment of the invention results in the formation of a layer of highly pure $Si_3N_4$ at a rate of about 2.70 Å per cycle. The formation of the $Si_3N_4$ layer occurs at a relatively low temperature of 550° C., and in a relatively short cycle time of less than about 90 seconds.

EXAMPLE 7

A silicon wafer was placed in a deposition chamber of typical design. The chamber was purged with nitrogen, then evacuated to 2 Torr. The substrate was heated to 550° C. and stabilized at that temperature. A first reactant stream was generated by bubbling 500 sccm of Ar through liquid $Si_2Cl_6$ at 40° C. Another stream containing Si and Cl was generated by bubbling 500 sccm of Ar through liquid $SiCl_4$ at 20° C. The $Si_2Cl_6$-containing stream was then introduced into the chamber for 30 seconds. Beginning 15 seconds after initiation of the $Si_2Cl_6$-containing stream, the $SiCl_4$-containing stream was introduced into the chamber for 15 seconds, during which time both the $Si_2Cl_6$-containing stream and the $SiCl_4$-containing stream were simultaneously flowing into the chamber, and after which, the flow of each stream was stopped. The chamber was then purged with $N_2$ for 5 seconds, and vacuum purged for 5 seconds. A second reactant stream of $NH_3$ plasma in an Ar carrier was generated by introducing a stream of $NH_3$ in an Ar carrier gas into a plasma chamber. The $NH_3$ plasma was generated by use of plasma generator operating at 400 watts. A flow of 2000 sccm of $NH_3$ plasma/Ar mixture was then introduced into the chamber for 30 seconds. The chamber was then purged with $N_2$ for 5 seconds, and then vacuum purged for 5 seconds.

It was found that by the foregoing steps, a $Si_3N_4$ film was formed at a rate of 2.53 Å per cycle. The refractive index was 1.96 at a wavelength of 632.8 nm, indicating that the deposited layer was stoichiometric $Si_3N_4$. The $Si_3N_4$ deposited by this method exhibits a Si:N ratio comparable to that of pure $Si_3N_4$, and has very low contaminant levels. The hydrogen content was <2.5%, and no oxygen was detected. Step coverage was 98% or higher in a structure having an aspect ratio of 5:1, and the film exhibited a pattern loading effect of about 5% or less. In this example, other silicon wafers were subjected to repeated cycles the same as that above. It was found that thickness of the Si3N$_4$ film bears a linear relationship to the number of cycles. Example 7 thereby demonstrates that this embodiment of the invention results in the formation of a layer of highly pure Si$_3$N$_4$ at a rate of about 2.53 Å per cycle. The formation of the Si$_3$N$_4$ layer occurs at a relatively low temperature of 550° C., and in a relatively short cycle time of less than about 90 seconds.

The foregoing examples and description of preferred embodiments are intended to be illustrative of the present invention, and are not intended to be limiting of the scope of the following claims. Those skilled in the art will recognize that various modifications of one or more of the foregoing methods are possible without departing from the scope of the following claims.

What is claimed is:

1. An atomic layer deposition method of forming a solid thin film layer containing silicon comprising the steps of:
    (a) placing a substrate into a chamber;
    (b) injecting a first reactant containing two or more compounds into the chamber, each said compound containing Si and Cl;
    (c) chemisorbing a first portion of the first reactant onto the substrate and physisorbing a second portion of the first reactant onto the substrate;
    (d) removing the non-chemically absorbed second portion of the first reactant from the chamber;
    (e) injecting a second reactant including NH$_3$ into the chamber;
    (f) chemically reacting a first portion of the second reactant with the chemisorbed first portion of the first reactant to form a silicon-containing solid on the substrate; and,
    (g) removing non-reacted portions of the second reactant from the chamber.

2. A method as claimed in claim 1, wherein the silicon-containing solid formed on the substrate comprises Si$_3$N$_4$.

3. A method as claimed in claim 1, wherein the silicon-containing solid comprises a Si$_3$N$_4$ thin film.

4. A method as claimed in claim 1, wherein a component ratio of N/Si of said silicon-containing solid is between about 1–1.6 inclusive.

5. A method as claimed in claim 1, which further comprises the step of heating the substrate to between 350 and 700° C.

6. A method as claimed in claim 1, which further comprises the step of pressurizing the chamber to an absolute pressure of 0.01–100 torr.

7. A method as claimed in claim 1, wherein a chamber pressure is maintained at a constant absolute pressure of 0.01–100 torr.

8. A method as claimed in claim 1, which further comprises the step of changing a chamber pressure during implementing at least one of said steps.

9. A method as claimed in claim 1, wherein the silicon-containing solid formed on the substrate has a dry etch selectivity with respect to a silicon material (active mask nitride).

10. A method as claimed in claim 1, wherein the silicon-containing solid formed on the substrate has a dry etch selectivity with respect to a gate material selected from the group consisting of WSix and doped poly-silicon (gate mask nitride).

11. A method as claimed in claim 1, wherein the silicon-containing solid formed on the substrate has a dry etch selectivity with respect to a conductive material selected from the group consisting of W and Ti/TiN (bit line mask nitride).

12. A method as claimed in claim 1, herein the silicon-containing material comprises a chemical mechanical polishing stopping layer.

13. A method as claimed in claim 1, wherein the silicon-containing solid formed on the substrate comprises an insulating layer having a dry etch selectivity with respect to SiO$_2$.

14. A method as claimed in claim 1, wherein the silicon-containing solid formed on the substrate comprises an insulating layer having an HF-containing solution wet etch selectivity with respect to SiO$_2$ of a semiconductor device.

15. A method as claimed in claim 1, wherein the silicon-containing solid formed on the substrate comprises a gate dielectric of a semiconductor device.

16. A method as claimed in claim 1, wherein the silicon-containing solid formed on the substrate comprises a layer formed between a Ta$_2$O$_5$ layer and a storage node of a capacitor of a semiconductor device.

17. A method as claimed in claim 1, wherein the silicon-containing solid formed on the substrate comprises a dielectric layer of a capacitor of a semiconductor device.

18. A method as claimed in claim 1, wherein the silicon-containing solid formed on the substrate comprises an STI liner of a semiconductor device.

19. A method as claimed in claim 1, wherein the second reactant containing NH$_3$ includes contains activated NH$_3$.

20. A method as claimed in claim 1, wherein the plasma power of the remote plasma method is between about 100–3000 watts inclusive.

21. An atomic layer deposition method according to claim 1, which further comprises repeating at least one of steps (b)–(f).

22. An atomic layer deposition method of forming a solid thin film layer containing silicon comprising the steps of:
    (a) placing a substrate into a chamber;
    (b) injecting a flow of a first reactant containing Si$_2$Cl$_6$ into the chamber;
    (c) while injecting the first reactant into the chamber, adding SiCl$_4$ to the flow of the first reactant;
    (d) chemisorbing first portions of the Si$_2$Cl$_6$ and the SiCl$_4$ onto the substrate;
    (e) removing non-chemically absorbed portions of the second reactant from the chamber;
    (f) injecting a second reactant including NH$_3$ into the chamber;
    (g) chemically reacting a first portion of the second reactant with the respective chemisorbed portions of the Si$_2$Cl$_6$ and the SiCl$_4$ to form a silicon-containing solid on the substrate; and,
    (h) removing the non-reacted second portion of the second reactant from the chamber.

23. A method as claimed in claim 22 further comprising the step of repeating at least one of steps (b)–(h).

24. A method as claimed in claim 22, wherein the second reactant containing NH$_3$ contains activated NH$_3$.

* * * * *

UNITED STATES PATENT AND TRADEMARK OFFICE
CERTIFICATE OF CORRECTION

PATENT NO. : 6,528,430 B2  Page 1 of 1
DATED : March 4, 2003
INVENTOR(S) : Kwan et al.

It is certified that error appears in the above-identified patent and that said Letters Patent is hereby corrected as shown below:

Drawings,
FIG. 7, Step 120, "REMOVE PHYSISORBED SECOND RECONED REACTANT" should read -- REMOVE PHYSISORBED SECOND RECONED REACTANT --.

Column 1,
Line 39, "in general is, less" should read -- in general is less --.

Column 5,
Line 26, "purged or 5 seconds" should read -- purged for 5 seconds --.

Column 7,
Line 65, "chamber the" should read -- chamber, the --.

Column 8,
Line 8, "for 30 seconds again" should read -- for 30 seconds, again --.

Column 9,
Line 1, "of the Si3N4 film" should read -- of the $Si_3N_4$ film --.
Line 58, "to a silicon material (active mask nitride)." should read -- to a silicon material. --.
Line 63, "doped poly-silcon (gate mask nitride)." should read -- doped poly-silicon. --.

Column 10,
Line 4, "W and Ti/N (bit line mask nitride)." should read -- W and Ti/TiN. --.

Signed and Sealed this

Third Day of August, 2004

JON W. DUDAS
*Acting Director of the United States Patent and Trademark Office*